(12) United States Patent
Radke

(10) Patent No.: US 7,738,292 B2
(45) Date of Patent: *Jun. 15, 2010

(54) FLASH MEMORY WITH MULTI-BIT READ

(75) Inventor: William Henry Radke, Los Gatos, CA (US)

(73) Assignee: Micron Technology, Inc., Boise, ID (US)

(*) Notice: Subject to any disclaimer, the term of this patent is extended or adjusted under 35 U.S.C. 154(b) by 105 days.

This patent is subject to a terminal disclaimer.

(21) Appl. No.: 12/099,702

(22) Filed: Apr. 8, 2008

(65) Prior Publication Data

US 2008/0215930 A1 Sep. 4, 2008

Related U.S. Application Data

(63) Continuation of application No. 11/503,612, filed on Aug. 14, 2006, now Pat. No. 7,369,434.

(51) Int. Cl.
*G11C 16/00* (2006.01)

(52) U.S. Cl. .............................. 365/185.03; 365/185.09

(58) Field of Classification Search ............. 365/185.02
See application file for complete search history.

(56) References Cited

U.S. PATENT DOCUMENTS

| 2,717,315 | A | | 9/1955 | Nemet et al. |
|---|---|---|---|---|
| 5,077,737 | A | | 12/1991 | Leger et al. |
| 5,621,682 | A | * | 4/1997 | Tanzawa et al. ........ 365/185.03 |
| 5,646,835 | A | | 7/1997 | Katcha |
| 5,754,567 | A | | 5/1998 | Norman |
| 5,787,484 | A | | 7/1998 | Norman |
| 5,815,458 | A | | 9/1998 | Chevallier |
| 5,854,800 | A | | 12/1998 | Thomann et al. |
| 5,864,569 | A | | 1/1999 | Roohparvar |
| 5,910,921 | A | | 6/1999 | Beffa et al. |
| 5,923,682 | A | | 7/1999 | Seyyedy |
| 5,925,138 | A | | 7/1999 | Klein |
| 5,935,258 | A | | 8/1999 | Klein |
| 6,034,891 | A | | 3/2000 | Norman |
| 6,076,182 | A | | 6/2000 | Jeddeloh |
| 6,112,314 | A | | 8/2000 | Norman et al. |
| 6,141,247 | A | | 10/2000 | Roohparvar et al. |
| 6,178,537 | B1 | | 1/2001 | Roohparvar |
| 6,279,072 | B1 | | 8/2001 | Williams et al. |
| 6,331,948 | B2 | | 12/2001 | Kasai et al. |
| 6,381,672 | B1 | | 4/2002 | Strongin et al. |

(Continued)

OTHER PUBLICATIONS

"Micron ECC Module for NAND Flash via Xilinx Spartan-3 FPGA", *Micron Technical Note* 2906, (2005),21 pgs.

(Continued)

*Primary Examiner*—Tan T. Nguyen
(74) *Attorney, Agent, or Firm*—Schwegman, Lundberg & Woessner, P.A.

(57) ABSTRACT

A memory device is described that uses extra data bits stored in a multi-level cell (MLC) to provide error information. An example embodiment provides a memory cell that uses more than $2^X$ logic levels to store X data bits and an error bit. At least one extra bit provided during a read operation is used to provide error information or a confidence factor of the X data bits originally stored in the cell.

25 Claims, 2 Drawing Sheets

U.S. PATENT DOCUMENTS

| | | | |
|---|---|---|---|
| 6,542,407 B1 * | 4/2003 | Chen et al. | 365/185.17 |
| 6,600,676 B2 * | 7/2003 | Shibata et al. | 365/185.04 |
| 6,657,899 B2 | 12/2003 | Roohparvar | |
| 6,674,836 B2 | 1/2004 | Harada et al. | |
| 6,728,825 B1 | 4/2004 | Norman | |
| 6,734,865 B1 | 5/2004 | Peterson et al. | |
| 6,741,253 B2 | 5/2004 | Radke et al. | |
| 6,775,168 B1 | 8/2004 | Park et al. | |
| 6,784,889 B1 | 8/2004 | Radke | |
| 6,838,331 B2 | 1/2005 | Klein | |
| 6,870,749 B1 | 3/2005 | Park et al. | |
| 6,870,774 B2 | 3/2005 | Roohparvar et al. | |
| 6,883,044 B1 | 4/2005 | Roohparvar | |
| 6,906,691 B2 | 6/2005 | Park et al. | |
| 6,975,698 B2 | 12/2005 | Katcha et al. | |
| 6,982,900 B2 | 1/2006 | Hirabayashi | |
| 6,987,684 B1 | 1/2006 | Branth et al. | |
| 6,999,376 B2 | 2/2006 | Roohparvar | |
| 7,196,928 B2 | 3/2007 | Chen | |
| 7,369,434 B2 | 5/2008 | Radke | |
| 7,397,697 B2 * | 7/2008 | So et al. | 365/185.09 |
| 7,453,723 B2 | 11/2008 | Radke | |
| 2001/0023475 A1 | 9/2001 | Pawlowski | |
| 2002/0070941 A1 | 6/2002 | Peterson et al. | |
| 2003/0041210 A1 | 2/2003 | Keays | |
| 2003/0067472 A1 | 4/2003 | Radke et al. | |
| 2003/0115538 A1 | 6/2003 | Derner et al. | |
| 2004/0183808 A1 | 9/2004 | Radke et al. | |
| 2005/0172207 A1 | 8/2005 | Radke et al. | |
| 2005/0268203 A1 | 12/2005 | Keays et al. | |
| 2006/0248434 A1 | 11/2006 | Radke et al. | |
| 2007/0206434 A1 | 9/2007 | Radke | |
| 2008/0037320 A1 | 2/2008 | Radke | |
| 2009/0067249 A1 | 3/2009 | Radke | |

OTHER PUBLICATIONS

"NAND Flash Memory MT29F4G08AAA, MT29F8G08BAA, MT29F8G08DAA, MT29F16G08FAA", (Aug. 2006), 81 pgs.

* cited by examiner

FLASH MEMORY WITH MULTI-BIT READ

RELATED APPLICATION(S)

This application is a Continuation of U.S. application Ser. No. 11/503,612, filed Aug. 14, 2006 now U.S. Pat. No. 7,369,434, which is incorporated herein by reference.

FIELD OF THE INVENTION

The present invention relates to non-volatile memory devices and, more particularly, to flash memory devices.

BACKGROUND

Flash memory is non-volatile, which means that it stores information on a semiconductor in a way that does not need power to maintain the information in the chip. Flash memory stores information in an array of transistors, called "cells," each of which stores one or more bits of information. Current flash memory devices are made in two forms: NOR flash and NAND flash. The names refer to the type of logic used in the storage cell array.

A flash cell is similar to a standard MOSFET transistor, except that it has two gates instead of just one. One gate is the control gate (CG) like in other MOS transistors, but the second is a floating gate (FG) that is insulated all around by an oxide layer. The FG is between the CG and the substrate. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the CG, electrical current will either flow or not flow between the cell's source and drain connections, depending on the Vt of the cell. This presence or absence of current can be sensed and translated into 1's and 0's, reproducing the stored data.

During data read and write functions, voltage coupling can influence proper memory operation. Further, close physical proximity of memory cells can result in cell to cell coupling that can influence proper memory operation and data accuracy.

For reasons stated below which will become apparent to those skilled in the art upon reading and understanding the present specification, there is a need for methods and devices to detect errors present in stored data.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dice, as is well known in the art. The figures are provided to help facilitate an understanding of the detailed description, are not intended to be accurate in scale, and have been simplified. The term conductor as used herein is intended to include conductors and semi-conductors, including but not limited to metals, metal alloy, doped silicon and polysilicon.

The following detailed description is, therefore, not to be taken in a limiting sense, and the scope of the present invention is defined only by the appended claims, along with the full scope of equivalents to which such claims are entitled.

Figure 1:
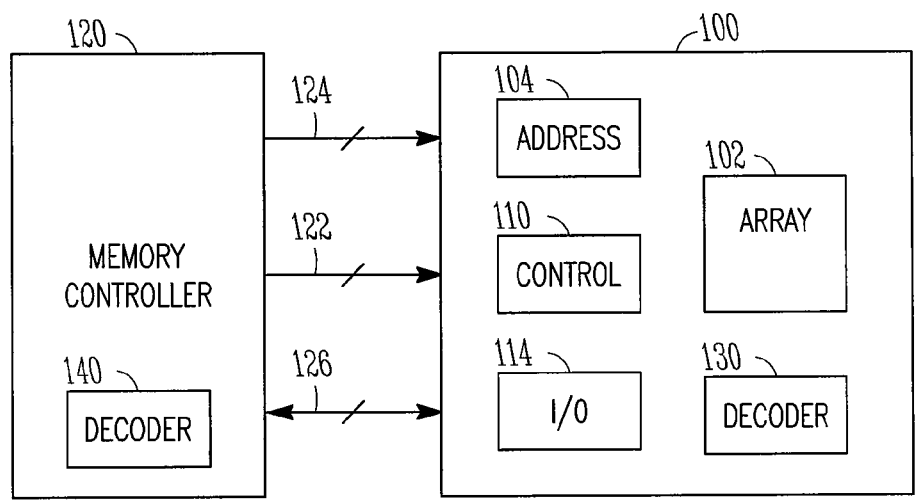
FIG. 1 is a block diagram of a memory device according to embodiments of the present invention.

FIG. 1 is a simplified block diagram of an integrated circuit memory device 100 in accordance with an embodiment of the invention. The memory device 100 includes an array of non-volatile floating gate memory cells 102, address circuitry 104, control circuitry 110, and Input/Output (I/O) circuitry 114. The memory cells are also referred to as Flash memory cells because blocks of memory cells are typically erased concurrently, in a 'flash' operation.

The memory device 100 can be coupled to a processor 120 or other memory controller for accessing the memory array 102. The memory device 100 coupled to a processor 120 forms part of an electronic system. Some examples of electronic systems include personal computers, peripheral devices, wireless devices, digital cameras, personal digital assistants (PDA's) and audio recorders.

The memory device 100 receives control signals across control lines 122 from the processor 120 to control access to the memory array 102 via control circuitry 110. Access to the memory array 102 is directed to one or more target memory cells in response to address signals received across address lines 124. Once the array is accessed in response to the control signals and the address signals, data can be written to or read from the memory cells across data, DQ, lines 126.

In addition to general memory functions, control circuit 110 performs a read operation on the memory cells. As explained below, the read operation provides error bit(s) in addition to data to allow for a more informed reading of data. The memory cells of FIG. 1, in one embodiment, have greater than $2^X$ data levels used to read X bits of data, where X is an integer. The additional data levels not used as the X bits are provided as error bit(s).

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features of a typical memory device.

Figure 2:
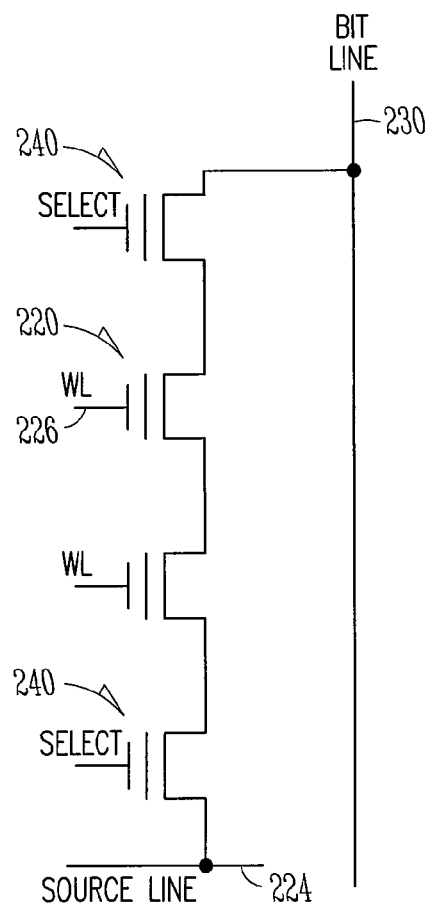
FIG. 2 illustrates a simplified portion of a NAND flash memory array of an embodiment of FIG. 1.

FIG. 2 illustrates a simplified portion of a NAND flash memory array of an embodiment of FIG. 1. NAND Flash uses electron tunnel or electron injection for writing and tunnel release for erasing. The NAND memory includes floating gate memory cells 220 coupled to source line 224, word lines 226 and a bit line 230. The cells are coupled in series between the bit line and source line. One or more bit line select transistors 240 are used to selectively isolate the cells from the bit and source lines.

In a read operation, a word line of a target (selected) memory cell can be adjusted to predetermined voltage levels for reading multiple state levels of the multi-level cells (MLC). All unselected cell word lines are coupled to a voltage sufficiently high to activate the unselected cells regardless of their floating gate charge. Depending upon the programmed state of the MLC selected cell, the word line may activate the selected cell.

In prior art, memory cells have been used to store one data bit in a binary manner as either a first or second data state. For example, a logic one may be stored as a charge on a dynamic cell and a logic zero is represented by a discharged dynamic cell. Likewise, the flash cell stores one bit as a threshold activation level. To increase data storage capacity, prior art multiple level memory cells were developed to allow for storage of multiple data bits. As such, a two state memory cell stores one bit of data and a four state memory cell is used to store two bits of data. Thus, a prior art memory cell with $2^x$ states stores X bits of data.

Embodiments of the present invention use multilevel memory cells to store a single bit of data. In contrast to traditional multilevel cells the invention does not increase memory device capacity by using multilevel cells, but uses the extra states of the memory cell for error information.

Figure 3:
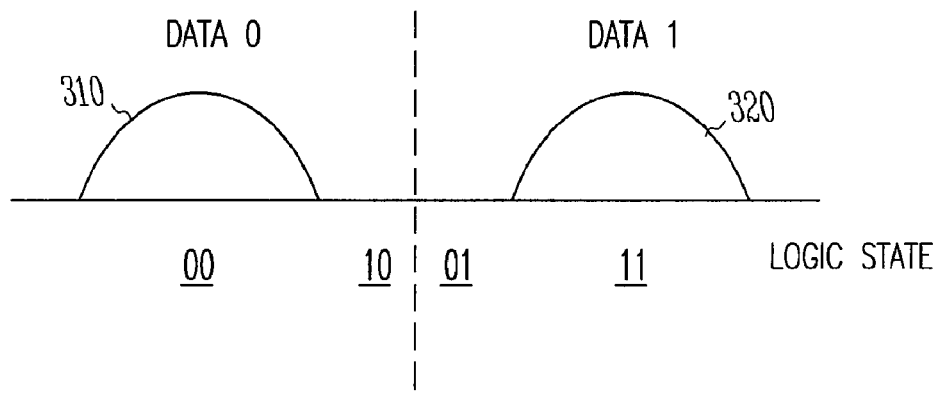
FIG. 3 illustrates data states of memory cells of an array of FIG. 1.

Distributions of logic states for a plurality of memory cells of a memory device is illustrated in FIG. 3. A four state memory cell is programmed to either a binary "00" data state or a "11" data state to represent a logic zero or one, respectively. The "01" and "10" data states are not used during programming. Thus, the least significant bit (LSB) provides the data to be retained by the memory and the most significant bit is used as an error bit. During a read operation, the memory cell data state is read and provided to a decoder. The decoder 130 can be located within the memory device 100 or external to the memory device, such as decoder 140 with the processor 120 of FIG. 1.

If the memory cell output is a "00" data state or a "11" data state, the cell data represents a strong logic zero (curve 310) or one (curve 320), respectively. If the memory cell output is a "01" or a "10" data state, the cell data represents a weak logic zero or one, respectively. That is, a weak data state indicates that the original data state of the memory cell has changed and the data bit may be erroneous.

State changes in a multilevel cell are possible. However, multiple state changes where both bits of data change are much less likely. By programming the multilevel cell using the LSB to store the data, the probability of both bits changing is reduced.

Figure 4:
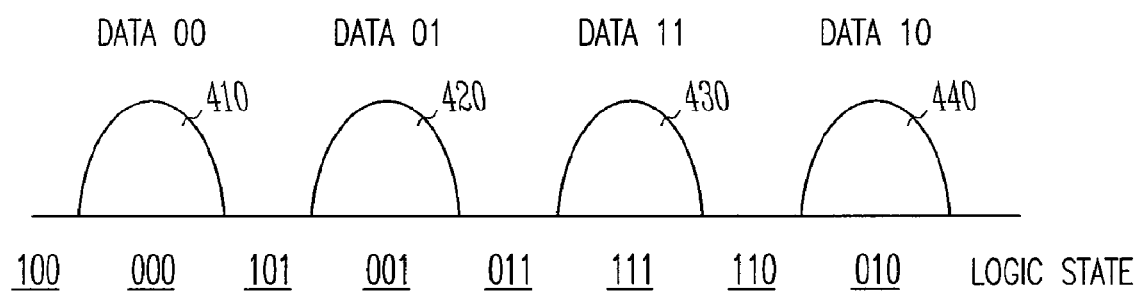
FIG. 4 illustrates data states of memory cells of an array of FIG. 1.

The present invention is not limited to the above example but can use eight data states to store two data bits and an error bit. As illustrated in FIG. 4, two data bits 00, 01, 11 and 10 are programmed into a memory as 000, 001, 111 and 010, respectively. As shown in curves 410, 420, 430 and 440 the two data bits and an error bit can be decoded. When the error bit state is changed from the programmed error bit state possible errors in the stored data can be flagged.

As such, four data levels are used to store one bit of data and an error bit and seven data levels are used to store two bits of data and an error bit. Additional embodiments provide a memory cell that uses greater than $2^x$ data levels to store X bits of data and at least one error bit, where X is an integer. In an embodiment where X=2, seven levels can be used: the 4 expected data states ($2^x$), and three additional intermediate values. The values beyond 00 and 11 are not used. In one embodiment a memory cell uses $2^{x+1}$ data levels to store X bits of data.

As explained above, the extra data states output from the memory cell are used by a decoder circuit to identify errors in the data and provide a confidence factor for the data. In addition to identifying suspect data, the extra data states can provide additional information for error detection and correction circuitry.

Although embodiments have been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

The invention claimed is:

1. A memory device comprising:
   a multilevel memory cell configured to store more than $2^x$ data levels representing X units of information, wherein at least one unit of the X units represents an error unit; and
   a decoder configured to decode the $2^x$ data levels and determine a confidence factor for the X units based upon the error unit.

2. The memory device of claim 1, wherein the more than $2^x$ data levels include at least a first data level and a second data level decodable as data units with a high confidence factor, while at least a portion of the remaining data levels are decodable as data units with a low confidence factor.

3. The memory device of claim 2, wherein at least the first data level and the second data level represent strong states, and at least a portion of the remaining data levels represent weak states.

4. The memory device of claim 1, wherein the decoder includes an error correction circuit to correct data errors identified by the confidence factor.

5. The memory device of claim 1, wherein the multilevel memory cell is a NAND memory cell.

6. A device, comprising:
   a memory cell programmable to one of more than $2^x$ logic states; and
   a decoder configured to decode an output from the memory cell, wherein the decoder decodes one of the more than $2^x$ logic states into X data units and determines a confidence factor for the X data units based upon a selected data unit decoded from the one of the more than $2^x$ logic states.

7. The system of claim 6, wherein the confidence factor is based upon a most significant bit (MSB) decoded from the X data units.

8. The memory device of claim 6, wherein the decoder includes an error correction circuit to correct data errors identified by the confidence factor.

9. The memory device of claim 6, wherein the multilevel memory cell is a NAND memory cell.

10. A memory device, comprising:
    a multilevel memory cell configured to store data levels corresponding to distinct logic states;
    a control circuit configured to program the multilevel memory cell to the distinct logic states, wherein the logic states include a least significant bit (LSB) and a most significant bit (MSB); and a decoder circuit configured to decode the memory cell, wherein the decoder reads the data without error when the LSB of the data and the MSB of the data are equal, and detects an error when the LSB and the MSB are not equal.

11. The memory device of claim 10, wherein the LSB is an information unit of the data, and the MSB is an information unit corresponding to an error unit.

12. The memory device of claim 10, comprising an error correction circuit configured to correct an error identified by the decoder.

13. The memory device of claim 10, wherein the multilevel memory cell comprises a non-volatile memory cell.

14. A system comprising:
a memory comprising multilevel memory cells programmable to one of more than $2^X$ states; and
a decoder configured to decode one of the more than $2^X$ states into X data units and determines a confidence factor for the X data units based upon a selected data unit decoded from the one of the more than $2^X$ states.

15. The system of claim 14, wherein the confidence factor is based upon a most significant bit (MSB) decoded from the X data units.

16. The system of claim 14, wherein the confidence factor is based upon a comparison between the most significant bit (MSB) and a least significant bit (LSB) decoded from the X data units.

17. The system of claim 14, wherein the confidence factor includes a high value and a low value, further comprising an error correction circuit configured to correct the X data units when the confidence factor has a low value.

18. The system of claim 14, wherein the confidence factor includes a high value and a low value, and the X data units are decoded as free from errors when the confidence factor has a high value.

19. The memory device of claim 14, wherein the multilevel memory cell is a NAND memory cell.

20. A method of storing data comprising:
storing X units of data as one of more than $2^X$ logic states in a memory device;
reading one of the more than $2^X$ logic states from the memory device; and
decoding the one of the more than $2^X$ data states to provide the X units of data that include at least one unit determining a confidence factor for the X bits.

21. The method of claim 20, wherein decoding the one of the more than $2^X$ data states comprises determining a high value and a low value for the confidence factor, wherein the high value indicates the X units of data are substantially error free, and a low value indicates the X units of data include an error.

22. The method of claim 20, wherein determining a high value and a low value for the confidence factor comprises comparing a least significant bit (LSB) and a most significant bit (MSB) for the X units of data, further wherein the LSB and the MSB are equal when the data are substantially error free.

23. The method of claim 20, wherein determining a high value and a low value for the confidence factor comprises determining a value for the MSB to determine if an error is present in the X units of data.

24. A method of operating a memory device comprising:
storing data in a multi-level cell (MLC) memory device, wherein each memory cell has discrete state levels defining at least a first and a second information unit; and
decoding data read from the memory device, wherein the second information bit indicates a confidence factor for the read data.

25. The method of claim 24, wherein decoding data read from the memory device comprises determining a high value and a low value for the confidence factor, wherein the high value indicates the data is substantially error free, and a low value indicates the data includes an error.

\* \* \* \* \*